US012117506B2

(12) United States Patent
Fukui et al.

(10) Patent No.: US 12,117,506 B2
(45) Date of Patent: Oct. 15, 2024

(54) MAGNETIC FIELD DETECTION DEVICE AND MAGNETIC FIELD DETECTION DEVICE ARRAY

(71) Applicant: TDK Corporation, Tokyo (JP)

(72) Inventors: Takato Fukui, Tokyo (JP); Tamon Kasajima, Tokyo (JP); Yuichiro Yamaji, Tokyo (JP); Taiju Akushichi, Tokyo (JP); Osamu Harakawa, Tokyo (JP); Makoto Kameno, Tokyo (JP)

(73) Assignee: TDK Corporation, Tokyo (JP)

( * ) Notice: Subject to any disclaimer, the term of this patent is extended or adjusted under 35 U.S.C. 154(b) by 114 days.

(21) Appl. No.: 17/927,134

(22) PCT Filed: May 10, 2021

(86) PCT No.: PCT/JP2021/017622
§ 371 (c)(1),
(2) Date: Nov. 22, 2022

(87) PCT Pub. No.: WO2021/241174
PCT Pub. Date: Dec. 2, 2021

(65) Prior Publication Data
US 2023/0204686 A1    Jun. 29, 2023

(30) Foreign Application Priority Data

May 28, 2020    (JP) .................................. 2020-092889

(51) Int. Cl.
*G01R 33/00*    (2006.01)
*G01R 33/09*    (2006.01)

(52) U.S. Cl.
CPC ....... *G01R 33/0041* (2013.01); *G01R 33/091* (2013.01)

(58) Field of Classification Search
CPC .............. G01R 33/0041; G01R 33/091; G01R 33/0206; G01R 33/025; G01R 33/0094
(Continued)

(56) References Cited

U.S. PATENT DOCUMENTS

2004/0263162 A1    12/2004    Kandori et al.
2015/0069846 A1     3/2015    Hokari
(Continued)

FOREIGN PATENT DOCUMENTS

CN    108 459 076 A    8/2018
JP    2005-016960 A    1/2005
(Continued)

OTHER PUBLICATIONS

International Search Report issued in corresponding International Patent Application No. PCT/JP2021/017622, dated Jul. 6, 2021, with English translation.
(Continued)

*Primary Examiner* — Giovanni Astacio-Oquendo
(74) *Attorney, Agent, or Firm* — Rimon P.C.

(57) ABSTRACT

To reduce the number of components and simplify the circuit configuration in a magnetic field detection device capable of detecting a weak magnetic field without using a shield room. A magnetic field detection device includes a cancel coil wound around a winding core part of a bobbin, magnetic sensors fixed to mutually different positions of the bobbin, and a feedback circuit that makes a cancel current flow in the cancel coil according to an output signal from the magnetic sensor to cancel the environmental magnetic field in a cancel space. Since the cancel coil is used in common for the magnetic sensors, it is possible to reduce the number of components to be used and to simplify the circuit configuration.

14 Claims, 16 Drawing Sheets

(58) Field of Classification Search
USPC .................................. 324/260, 262, 263, 200
See application file for complete search history.

(56) References Cited

U.S. PATENT DOCUMENTS

| | | |
|---|---|---|
| 2017/0219661 A1 | 8/2017 | Hata et al. |
| 2018/0149678 A1 | 5/2018 | Wolf et al. |
| 2020/0064414 A1* | 2/2020 | Uchida .................. G01R 33/09 |
| 2020/0209327 A1* | 7/2020 | Takahashi ............ G01R 33/091 |
| 2021/0345898 A1* | 11/2021 | Okatake ............. G01R 33/0041 |

FOREIGN PATENT DOCUMENTS

| | | |
|---|---|---|
| JP | 2017-133993 A | 8/2017 |
| JP | 2020-071198 A | 5/2020 |
| WO | 2018/190261 A1 | 10/2018 |

OTHER PUBLICATIONS

Extended European Search Report received in EP Application No. 21811992.3, dated May 24, 2024.

* cited by examiner

MAGNETIC FIELD DETECTION DEVICE AND MAGNETIC FIELD DETECTION DEVICE ARRAY

CROSS REFERENCE TO RELATED APPLICATIONS

This application is the U.S. National Phase under 35 U.S.C. § 371 of International Application No. PCT/JP2021/017622, filed on May 10, 2021, which claims the benefit of Japanese Patent Application No. 2020-092889, filed on May 28, 2020, the entire contents of each are hereby incorporated by reference.

TECHNICAL FIELD

The present invention relates to a magnetic field detection device and, more particularly, to a magnetic field detection device capable of detecting a weak magnetic field without using a shield room. The present invention also relates to a magnetic field detection device array including a plurality of magnetic field detection devices.

BACKGROUND ART

As a magnetic field detection device capable of detecting a weak magnetic field without a shield room, one described in Patent Document 1 is known. A magnetic field detection device exemplified in FIG. 1 of Patent Document 1 detects an environmental magnetic field using a reference magnetic sensor and makes a cancel current flow in a cancel coil based on the detected environmental magnetic field to thereby cancel the environmental magnetic field applied to a measurement magnetic sensor. On the other hand, a magnetic field detection device exemplified in FIG. 7 of Patent Document 1 extracts a environmental magnetic field component by adding output signals from a plurality of magnetic sensors and makes a cancel current flowing in cancel coils provided in the plurality of respective magnetic sensors to thereby cancel the environmental magnetic field applied to the plurality of magnetic sensors.

CITATION LIST

Patent Document

[Patent Document 1] JP 2017-133993A

SUMMARY OF THE INVENTION

Problem to be Solved by the Invention

However, in the magnetic field detection device exemplified in FIG. 1 of Patent Document 1, different cancel coils are assigned respectively to the measurement magnetic sensor and the reference magnetic sensor, so that the number of components is large. On the other hand, in the magnetic field detection device exemplified in FIG. 7 of Patent Document 1, cancel coils are assigned to the plurality of respective magnetic sensors, thus also increasing the number of components. Further, in the magnetic field detection device exemplified in FIG. 7 of Patent Document 1, it is necessary to add output signals from the plurality of magnetic sensors, thus complicating the circuit configuration.

It is therefore an object of the present invention to reduce the number of components and simplifying the circuit configuration in a magnetic field detection device and a magnetic field detection device array capable of detecting a weak magnetic field without using a shield room.

Means for Solving the Problem

A magnetic field detection device according to the present invention includes: a bobbin; a cancel coil wound around a winding core part of the bobbin; first and second magnetic sensors fixed to mutually different positions of the bobbin and configured to detect a magnetic field component in mutually the same direction; and a feedback circuit that makes a cancel current flow in the cancel coil according to an output signal of the first magnetic sensor to cancel an environmental magnetic field in a cancel space. The second magnetic sensor is disposed within the cancel space.

According to the present invention, the cancel coil is used in common for the first and second magnetic sensors, so that it is possible to reduce the number of components to be used and to simplify the circuit configuration.

In the present invention, the first and second magnetic sensors may each be disposed at a position overlapping the inner diameter area of the cancel coil as viewed in the axial direction of the cancel coil. This makes it possible to reduce the overall size of the device.

In the present invention, sensor heads of the first and second magnetic sensors may be different in position in the axial direction of the cancel coil. This makes it possible to prevent a signal magnetic field component from being cancelled by the cancel coil. In this case, the winding core part of the bobbin may have a first cavity opened at a first flange part and a second cavity opened at a second flange part, and the first and second magnetic sensors may be installed in the first and second cavities, respectively. This arrangement makes it possible to sufficiently separate the first and second magnetic sensors from each other. Further, in this case, the sensor head of the first magnetic sensor may protrude from the first flange part of the bobbin, and the sensor head of the second magnetic sensor may protrude from the second flange part of the bobbin. This arrangement makes it possible to bring an object to be measured close to the second magnetic sensor.

The magnetic field detection device according to the present invention may further have a circuit board fixed to the first or second flange part, and then the feedback circuit may be provided in the circuit board. This arrangement makes it possible to effectively use the first or second flange part.

The magnetic field detection device according to the present invention may have a plurality of the second magnetic sensors. This arrangement makes it possible to measure the spatial distribution of the signal magnetic field component.

The magnetic field detection device according to the present invention may further have a resistor connected in parallel to the cancel coil and having a resistance value larger than the equivalent series resistance of the cancel coil. This arrangement makes it possible to prevent oscillation of a feedback loop constituted by the first magnetic sensor, feedback circuit, and cancel coil.

A magnetic field detection device array according to one aspect of the present invention includes a plurality of the above-described magnetic field detection devices each having the plurality of second magnetic sensors. The plurality of magnetic field detection devices are arranged in a matrix with the axial directions of the cancel coils coinciding with one another. The present invention makes it possible to measure the spatial distribution of the signal magnetic field component over a wide range.

A magnetic field detection device array according to another aspect of the present invention is obtained by arranging a plurality of magnetic field detection devices in an array. At least one of the plurality of magnetic field detection devices has the same configuration as that of the magnetic field detection device having the plurality of second magnetic sensors. The remaining magnetic field detection devices each have a configuration obtained by removing the first magnetic sensor from the magnetic field detection device having the plurality of second magnetic sensors and configured to cancel the environmental magnetic field in a cancel space by making a cancel current flow in a cancel coil. The plurality of magnetic field detection devices constituting the magnetic field detection device array are arranged in a matrix with the axial directions of the cancel coils coinciding with one another. The present invention makes it possible to measure the spatial distribution of the signal magnetic field component over a wide range and also to reduce the number of magnetic sensors to be used.

In the present invention, the plurality of second magnetic sensors provided in each of the plurality of magnetic field detection devices are disposed at each of the intersections between a plurality of first virtual lines extending in a first direction perpendicular to the axial direction of the cancel coil and a plurality of second virtual lines extending in a second direction perpendicular to the axial direction of the cancel coil and the first direction, and a pitch between the plurality of first virtual lines and a pitch between the plurality of second virtual lines may be equal to each other, whereby the spatial distribution of the signal magnetic field component in an xy plane as a detection surface can be measured at equal intervals.

Advantageous Effects of the Invention

According to the present invention, there can be provided a magnetic field detection device and a magnetic field detection device array capable of detecting a weak magnetic field without using a shield room with a reduced number of components and a simplified circuit configuration.

MODE FOR CARRYING OUT THE INVENTION

Hereinafter, preferred embodiments of the present invention will be described in detail with reference to the accompanying drawings.

Figure 1:
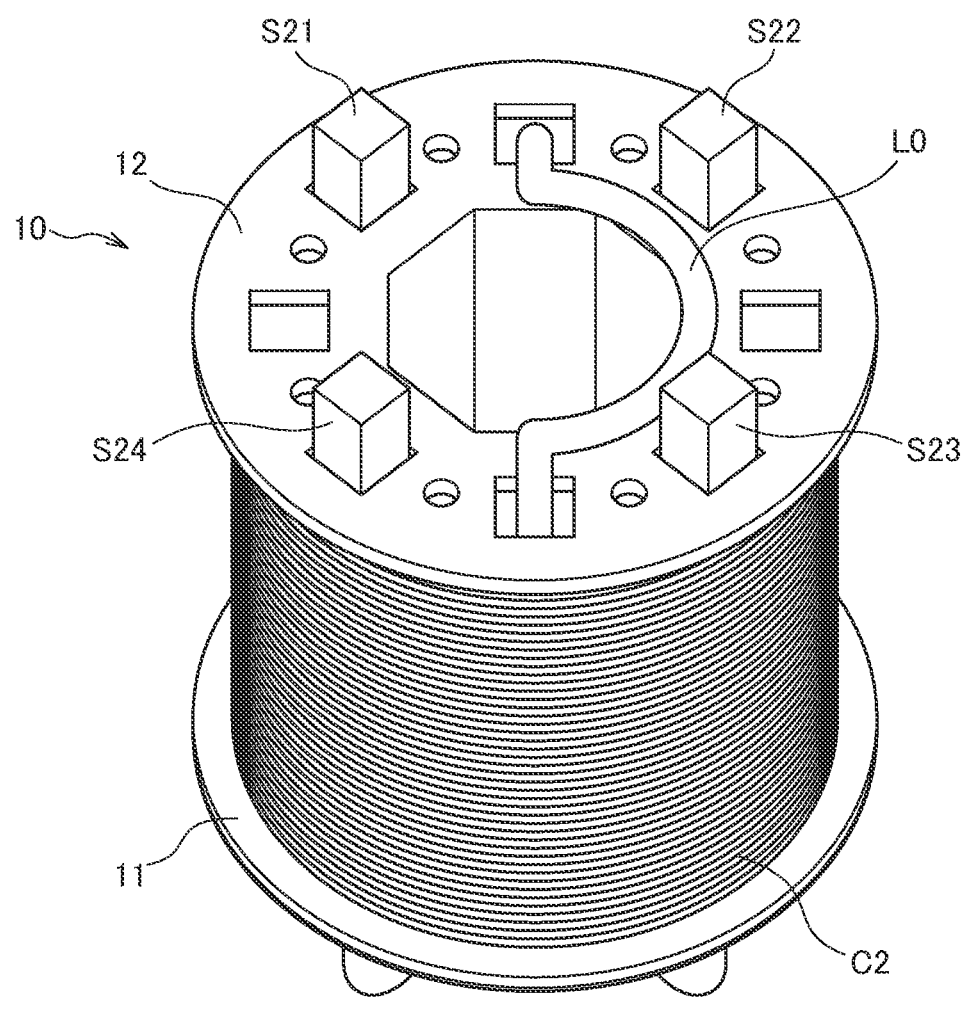
FIG. 1 is a schematic perspective view illustrating a magnetic field detection device 1 according to a first embodiment of the present invention seen from a measurement surface side.
Figure 2:
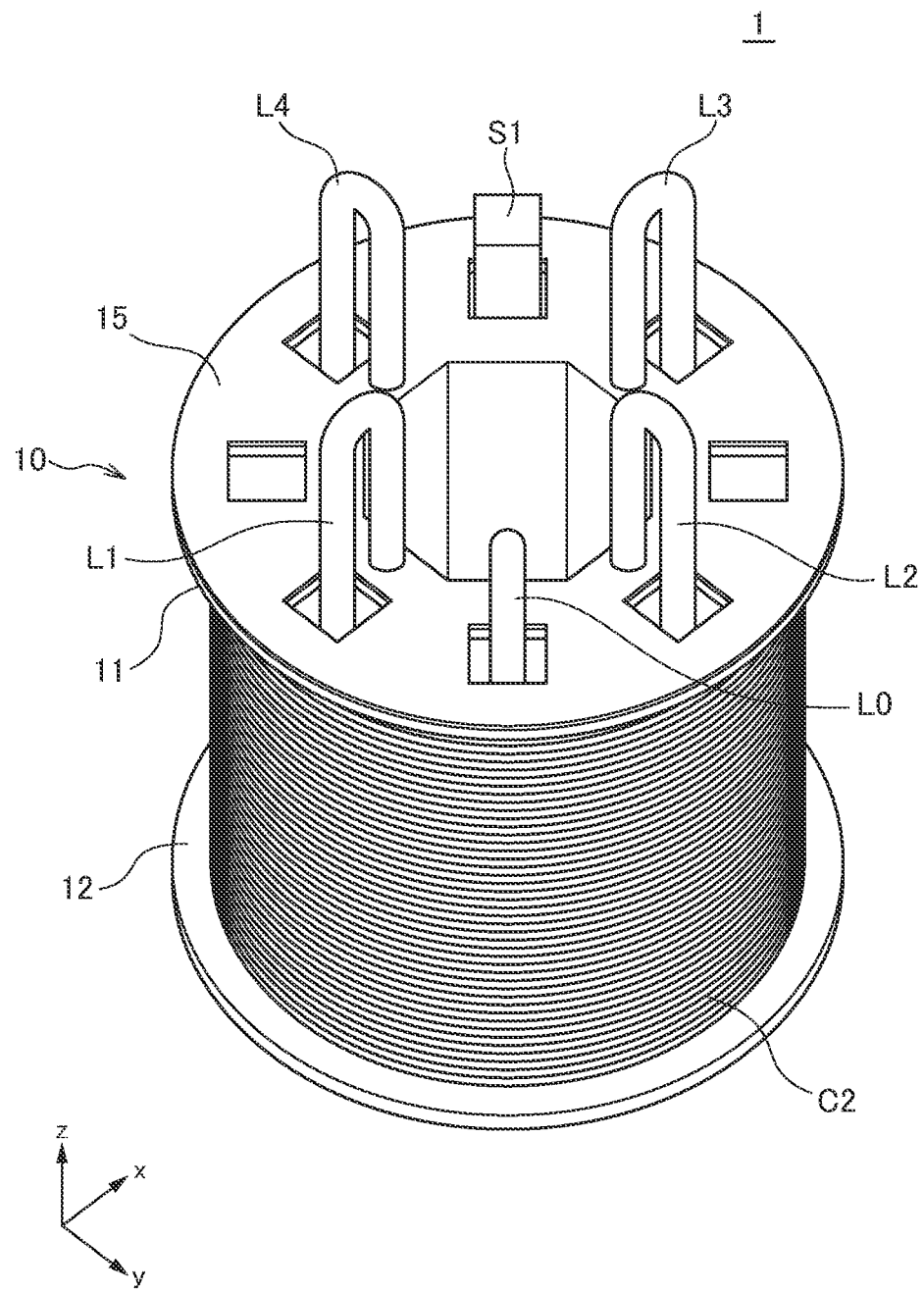
FIG. 2 is a schematic perspective view illustrating the magnetic field detection device 1 seen from a back surface side.

FIGS. 1 and 2 are views illustrating the outer appearance of a magnetic field detection device 1 according to a first embodiment of the present invention. FIG. 1 is a schematic perspective view seen from a measurement surface side, and FIG. 2 is a schematic perspective view seen from a back surface side.

Figure 3:
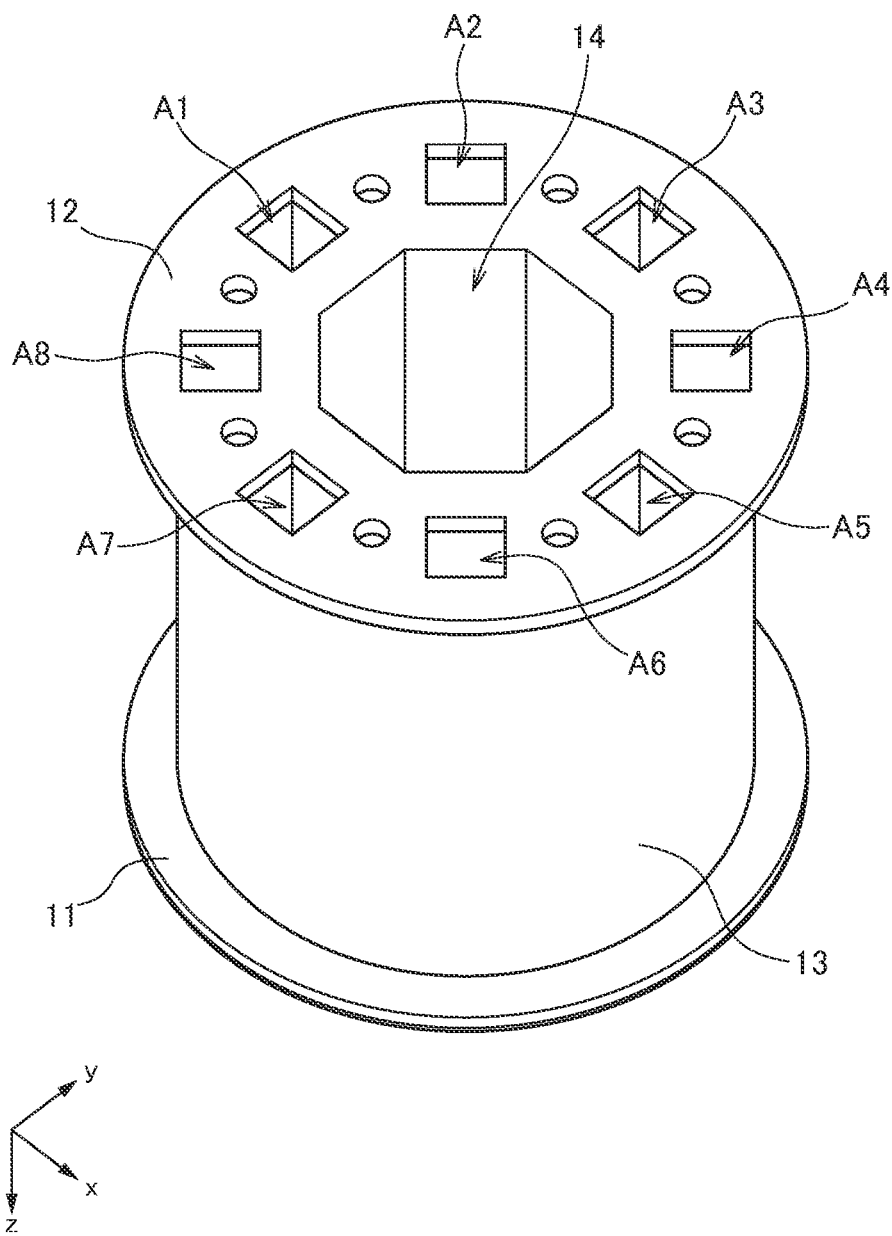
FIG. 3 is a schematic perspective view illustrating the outer appearance of a bobbin 10.

As illustrated in FIGS. 1 and 2, the magnetic field detection device 1 according to the first embodiment includes a bobbin 10 made of a resin material, a cancel coil C2 wound around the bobbin 10, and a plurality of magnetic sensors S1 and S21 to S24 fixed to the bobbin 10. As illustrated in FIG. 3, the bobbin 10 includes a winding core part 13 and flange parts 11 and 12 provided at both ends of the winding core part 13 in the z-direction. The outer peripheral surface of the winding core part 13 has a circular shape as viewed in the z-direction. The cancel coil C2 is wound around the winding core part 13 of the bobbin 10, and thus the axial direction of the cancel coil C2 is the z-direction. The winding core part 13 is formed into a tubular shape and has a hollow part 14 extending in the z-direction.

In the present embodiment, eight cavities A1 to A8 are formed in the winding core part 13 of the bobbin 10. The cavities A2 to A8 are through holes penetrating the winding core part 13 in the z-direction. One end of each of the cavities A1 to A8 in the z-direction is opened at the surface of the flange part 11, and the other end thereof in the z-direction is opened at the surface of the flange part 12. The radial direction positions of the respective cavities A1 to A8 are the same. In the present embodiment, the magnetic sensor S1 is installed in the cavity A6, and the magnetic sensors S21 to S24 are installed in the cavities A1, A3, A5, and A7 respectively. A sensor head of the magnetic sensor S1 protrudes in the z-direction from the flange part 11, and sensor heads of the respective magnetic sensors S21 to S24 protrude in the z-direction from the flange part 12. The magnetic sensors S1 and S21 to S24 are connected to a circuit board 15 fixed to the flange part 11 of the bobbin 10 through wirings L0 to L4, respectively. Although the cavities A2, A4, and A8 are vacant in the example illustrated in FIGS. 1 and 2, other magnetic sensors may be installed in the cavities A2, A4, and A8. That is, at most eight magnetic sensors may be fixed to the bobbin 10.

With the above configuration, the magnetic sensors S1 and S21 to S24 are each disposed at a position overlapping the inner diameter area of the cancel coil C2 as viewed in the z-direction. Further, the position of the sensor head of the magnetic sensor S1 in the z-direction and the positions of the sensor heads of the respective magnetic sensors S21 to S24 in the z-direction differ from each other. The positions of the sensor heads of the respective magnetic sensors S21 to S24 in the z-direction are the same. Further, the radial direction positions of the sensor heads centering around the coil axis are the same among the magnetic sensors S1 and S21 to S24.

The magnetic sensor S1 is a sensor for detecting an environmental magnetic field component such as terrestrial magnetism, while the magnetic sensors S21 to S24 are sensors for detecting a signal magnetic field component emitted from an object to be measured. The sensitivity axis directions of the magnetic sensors S1 and S21 to S24 are all along the z-direction. Although most part of each of the magnetic sensors S1 and S21 to S24 are positioned in the inner diameter area of the cancel coil C2, the sensor heads of the respective magnetic sensors S21 to S24 protrude from the flange part 12, as described above. This is intended to bring the sensor heads of the magnetic sensors S21 to S24 closer to an object to be measured. That is, when the sensor heads of the magnetic sensors S21 to S24 are embedded in the bobbin 10, a distance between an object to be measured and the sensor heads of the magnetic sensors S21 to S24 becomes large. On the other hand, the sensor head of the magnetic sensor S1 need not protrude from the flange part 11; however, to enhance the symmetry with the magnetic sensors S21 to S24, the magnetic sensor S1 preferably protrudes from the flange part 11 by the amount equal to the protruding amount of the magnetic sensors S21 to S24 from the flange part 12.

Figure 4:
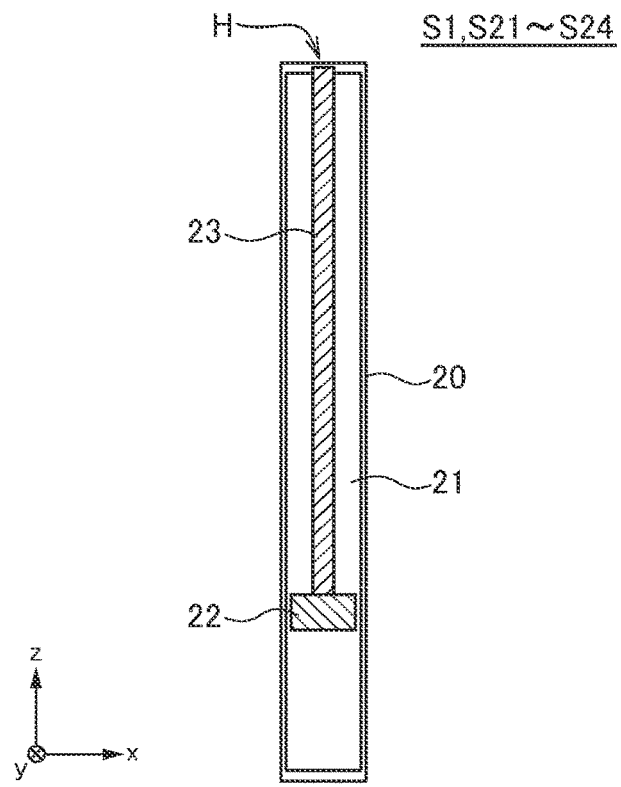
FIG. 4 is a schematic view illustrating an example of the internal structure of the magnetic sensors S1 and S21 to S24.

FIG. 4 is a schematic view illustrating an example of the internal structure of the magnetic sensors S1 and S21 to S24.

In the example illustrated in FIG. 4, the magnetic sensors S1 and S21 to S24 have the same structure and each include a sensor housing body 20, a substrate 21 housed in the sensor housing body 20, a sensor chip 22, and a magnetism collector 23. The sensor chip 22 and magnetism collector 23 are mounted on the substrate 21. The magnetism collector 23 has a rod-like shape extending in the z-direction and is made of a high permeability material such as ferrite. One end of the magnetism collector 23 in the z-direction constitutes a sensor head H, and the sensor chip 22 is disposed at the other end of the magnetism collector 23 in the z-direction. With this configuration, the signal magnetic field component in the z-direction component emitted from an object to be measured positioned in the vicinity of the sensor head H is collected by the magnetism collector 23 to be applied to the sensor chip 22.

Figure 5:
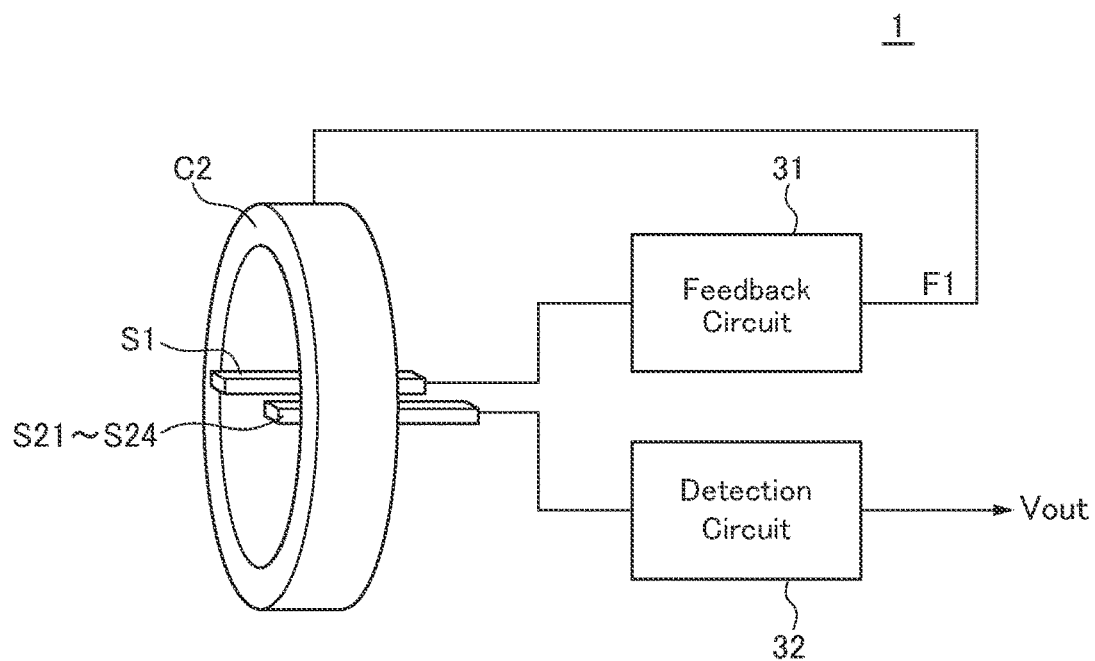
FIG. 5 is a block diagram illustrating the circuit configuration of the magnetic field detection device 1.

FIG. 5 is a block diagram illustrating the circuit configuration of the magnetic field detection device 1 according to the present embodiment.

As illustrated in FIG. 5, the magnetic field detection device 1 according to the present embodiment includes a feedback circuit 31 connected to the magnetic sensor S1 and a detection circuit 32 connected to the magnetic sensors S21 to S24. The feedback circuit 31 is a circuit generating a feedback current F1 for canceling the environmental magnetic field component, and the feedback current F1 generated by the feedback circuit 31 is supplied to the cancel coil C2. As a result, the magnetic sensor S1, feedback circuit 31, and cancel coil C2 constitute a feedback loop for canceling the environmental magnetic field component. On the other hand, the detection circuit 32 generates, according to output signals from the magnetic sensors S21 to S24, a detection signal Vout indicating the signal magnetic field component emitted from an object to be measured.

Figure 6:
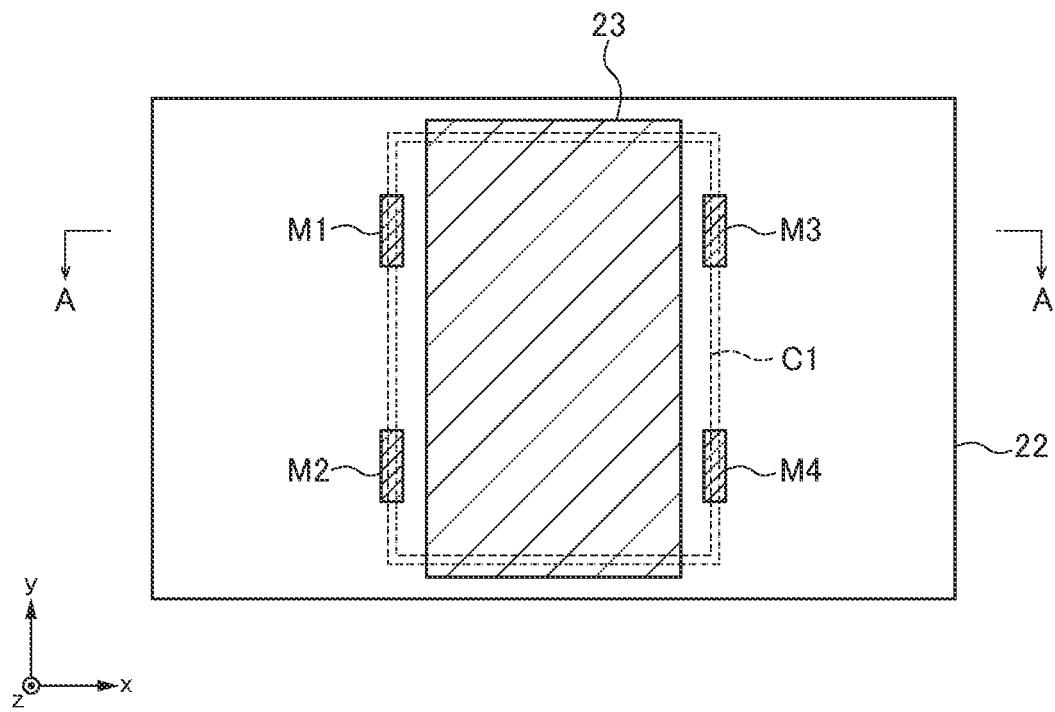
FIG. 6 is a schematic plan view of the sensor chip 22.
Figure 7:
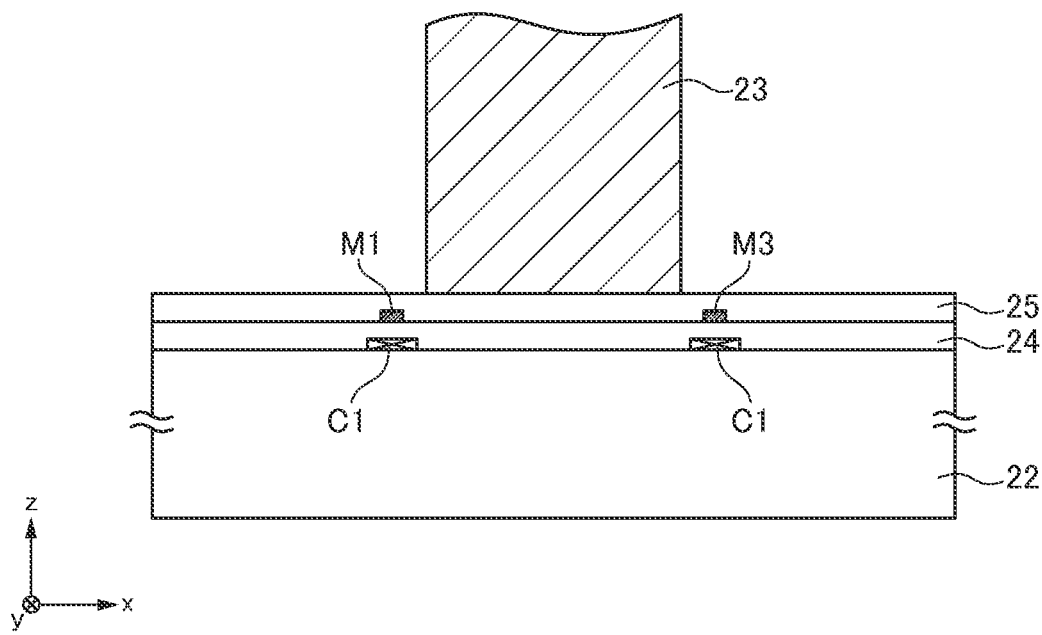
FIG. 7 is a schematic cross-sectional view taken along the line A-A in FIG. 6.

FIG. 6 is a schematic plan view of the sensor chip 22, and FIG. 7 is a schematic cross-sectional view taken along the line A-A in FIG. 6.

As illustrated in FIGS. 6 and 7, the sensor chip 22 has, on its element formation surface, four magnetoresistance effect elements M1 to M4 and a cancel coil C1. The cancel coil C1 is covered with an insulating film 24, and the magnetoresistance effect elements M1 to M4 are formed on the insulating film 24. The magnetoresistance effect elements M1 to M4 are covered with an insulating film 25. The magnetism collector 23 is disposed between the magnetoresistance effect elements M1, M2 and the magnetoresistance effect elements M3, M4 as viewed in the z-direction. With this configuration, a magnetic field in the z-direction collected by the magnetism collector 23 is distributed in the positive x-direction and the negative x-direction on the element formation surface of the sensor chip 22. As a result, magnetic field components in mutually opposite directions are applied to the magnetoresistance effect elements M1, M2 and magnetoresistance effect elements M3, M4. The fixed magnetization directions of the magnetoresistance effect elements M1 to M4 are made uniform in the positive x-direction or negative x-direction.

The cancel coil C1 is disposed so as to overlap the magnetoresistance effect elements M1 to M4. When a cancel current is made to flow in the cancel coil C1, cancel magnetic fields in mutually opposite directions are applied to the magnetoresistance effect elements M1, M2 and the magnetoresistance effect elements M3, M4.

Figure 8:
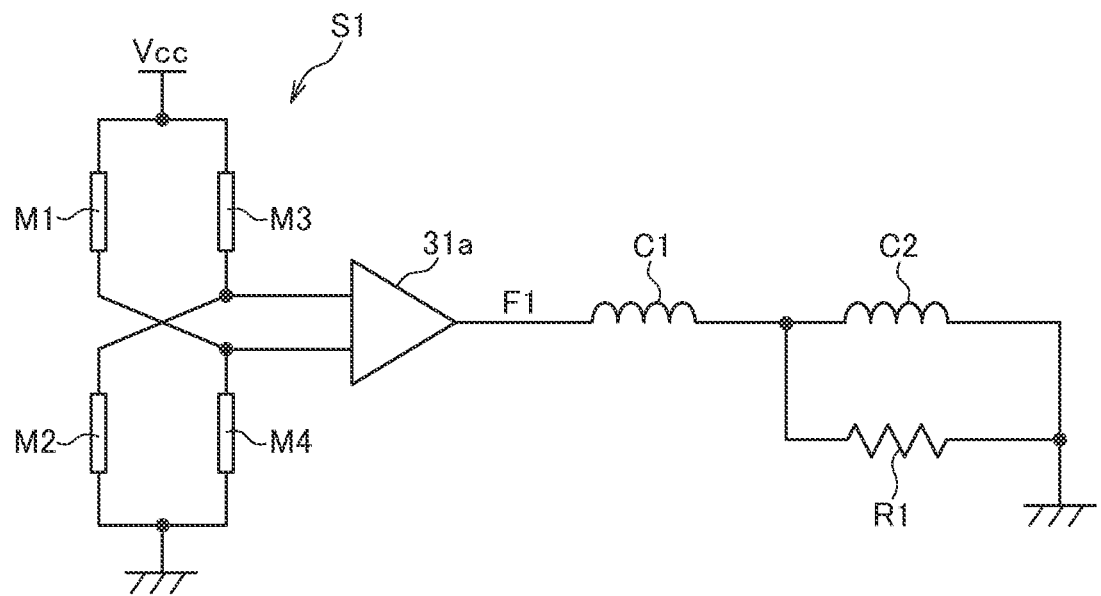
FIG. 8 is a circuit diagram of the feedback loop constituted by the magnetic sensor S1, feedback circuit 31, and cancel coil C2.

FIG. 8 is a circuit diagram of the feedback loop constituted by the magnetic sensor S1, feedback circuit 31, and cancel coil C2.

As illustrated in FIG. 8, the magnetoresistance effect elements M1 to M4 included in the magnetic sensor S1 are bridge-connected, and a differential signal generated thereby is supplied to a differential amplifier 31a included in the feedback circuit 31. The differential amplifier 31a generates the feedback current F1 based on the supplied differential signal. The feedback current F1 flows in the series-connected cancel coils C1 and C2. This causes the cancel coils C1 and C2 to generate a cancel magnetic field so as to make a differential signal component which is an output signal of the magnetic sensor S1 zero.

In the present embodiment, a resistor R1 is connected in parallel to the cancel coil C2. The resistance value of the resistor R1 is larger than the equivalent series resistance (ESR) of the cancel coil C2 and is preferably set to 10 times or more, and more preferably, 100 times or more the ESR of the cancel coil C2. Thus, of the feedback current F1, a lower frequency component attributable to terrestrial magnetism flows in the cancel coil C2, while a high frequency component that is a cause of oscillation is detoured to the resistor R1. This makes it possible to properly cancel the environmental magnetic field component such as terrestrial magnetism while preventing oscillation of the feedback loop.

Figure 9:
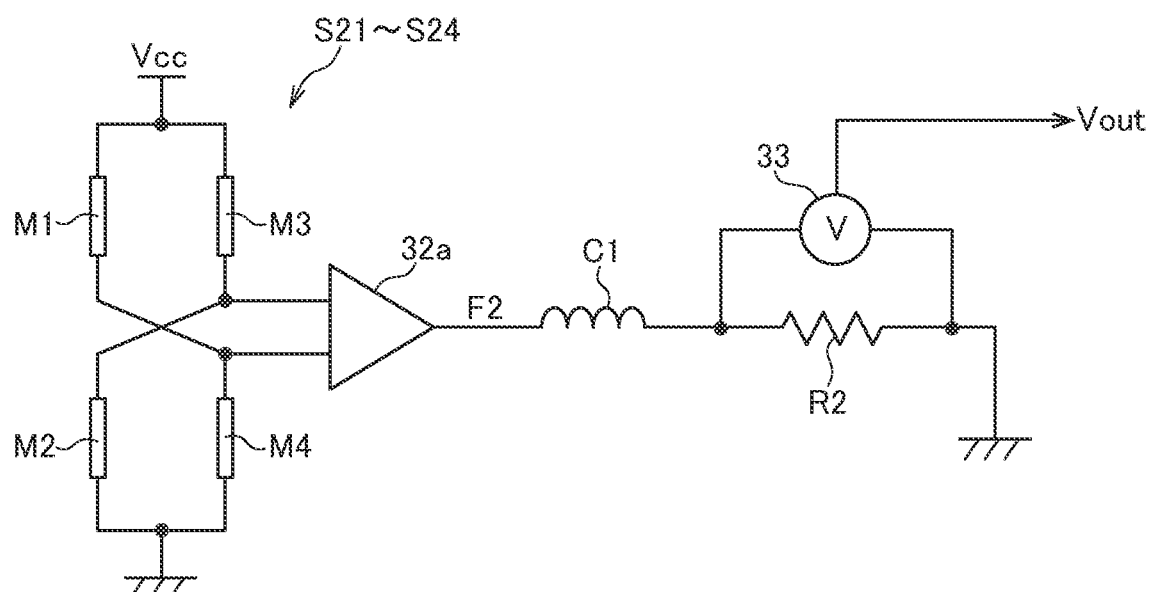
FIG. 9 is a circuit diagram of the magnetic sensors S21 to S24 and detection circuit 32.

FIG. 9 is a circuit diagram of a circuit constituted by the magnetic sensors S21 to S24 and detection circuit 32.

As illustrated in FIG. 9, the magnetoresistance effect elements M1 to M4 included in each of the magnetic sensors S21 to S24 are bridge-connected, and a differential signal generated thereby is supplied to a differential amplifier 32a. The differential amplifier 32a generates a feedback current F2 based on the differentia signal. The feedback current F2 flows in the cancel coil C1. This causes the cancel coil C1 to generate a cancel magnetic field so as to make a differential signal component as output signals of the magnetic sensors S21 to S24 zero.

Further, the detection circuit 32 has a resistor R2 that current-voltage converts the feedback current F2 and a voltage measurement circuit 33 that measures a voltage across the resistor R2. Thus, when the feedback current F2 flows, a detection signal Vout proportional to the amount of the flowing current is generated.

Figure 10:
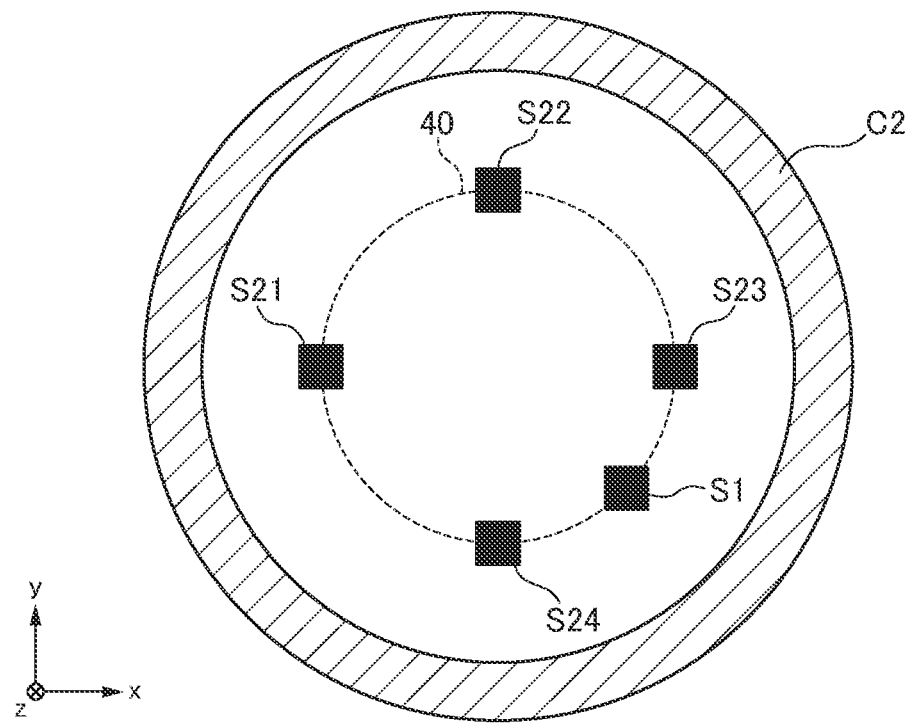
FIG. 10 is a schematic view for explaining the positions of the magnetic sensors S1 and S21 to S24 in the radial direction.

FIG. 10 is a schematic view for explaining the positions of the magnetic sensors S1 and S21 to S24 in the radial direction.

As illustrated in FIG. 10, as viewed in the axial direction (z-direction) of the cancel coil C2, the magnetic sensor S1 is disposed at a position offset from the center of the inner diameter area of the cancel coil C2. As described above, the cancel coil C2 generates a cancel magnetic field so as to make the environmental magnetic field component to be applied to the magnetic sensor S1 zero. However, the environmental magnetic field component becomes zero not only at the position where the magnetic sensor S1 is disposed but also in a cancel space 40 distributed concentrically with the cancel coil C2. This is because that the intensity distribution of the cancel magnetic field spreads concentrically, so that when the environmental magnetic field component is uniform, it is completely cancelled in the area lying in the same radial position as the magnetic sensor S1.

Figure 11:
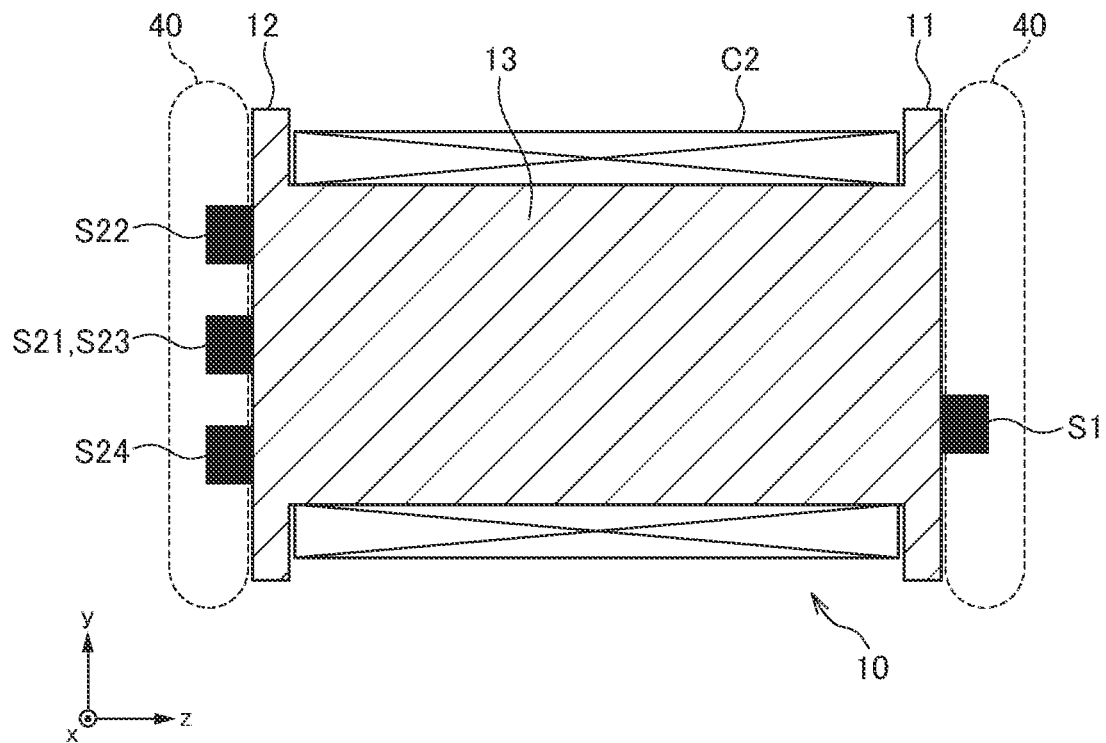
FIG. 11 is a schematic view for explaining the position of a cancel space 40.

As illustrated in FIG. 11, the cancel space 40 is present on the flange part 11 side where the sensor head of the magnetic sensor S1 is positioned, and also formed symmetrically on the flange part 12 side where the sensor heads of the magnetic sensors S21 to S24 are positioned. In the present embodiment, the magnetic sensors S21 to S24 are disposed in the cancel space 40 on the flange part 12 side. Thus, the environmental magnetic field component to be applied to the magnetic sensors S21 to S24 also becomes zero, with the result that only the signal magnetic field component emitted from an object to be measured is applied to the magnetic sensors S21 to S24. This makes it possible to detect even a weak magnetic field without using a shield room. In addition, the cancel coil C2 is assigned in common to the five magnetic sensors S1 and S21 to S24, so that it is possible to reduce the number of components and to simplify the circuit configuration.

In the present embodiment, the cavities A1 to A8 are disposed at the same radial position, so that the environmental magnetic field component to be applied to the magnetic sensors S21 to S24 becomes zero, no matter which one of the cavities any of the magnetic sensors S21 to S24 is installed in. In addition, in the present embodiment, the sensor head of the magnetic sensor S1 for detecting the environmental magnetic field component is provided on the flange part 11 side, and the sensor heads of the respective magnetic sensors S21 to S24 for detecting the signal magnetic field component are provided on the flange part 12 side, so that the signal magnetic field component emitted from an object to be measured is hardly applied to the magnetic sensor S1. This prevents a part or all of the signal magnetic field component from being cancelled. Thus, when measurement is performed with an object to be measured that generates a weak magnetic field brought close to the sensor heads of the magnetic sensors S21 to S24, the signal magnetic field component emitted from the object to be measured can be detected in real time. Further, since the cancel coil C2 and magnetic sensors S1 and S21 to S24 are fixed to the same bobbin 10, displacement between the cancel coil C2 and the magnetic sensors S1 and S21 to S24 hardly occurs.

Figure 12:
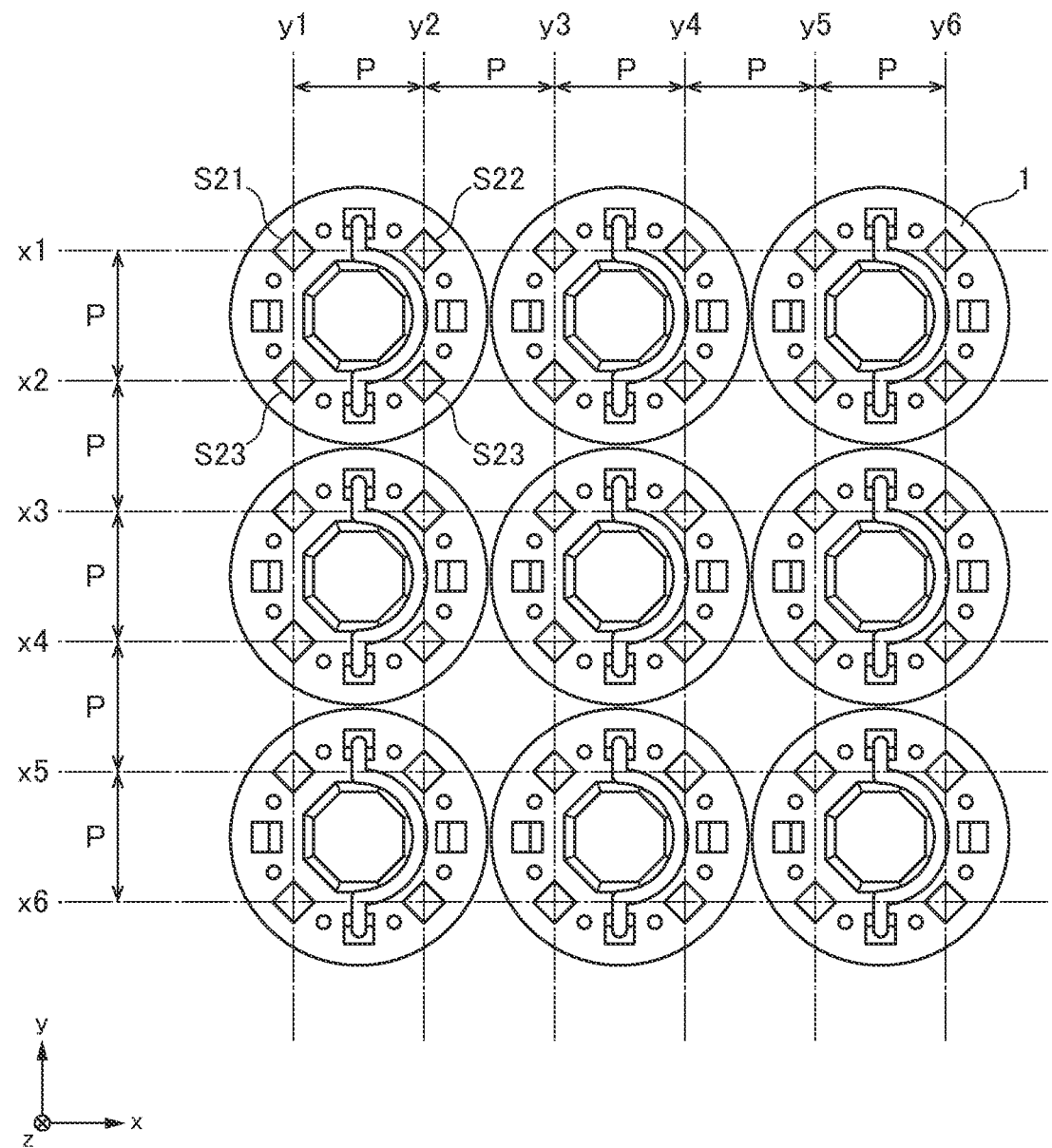
FIG. 12 is a schematic view for explaining an example in which a plurality of the magnetic field detection devices 1 are arranged in an array.

As descried above, using the magnetic field detection device 1 according to the present embodiment allows a weak magnetic field to be detected with high sensitivity by a simple configuration. Further, as illustrated in FIG. 12, when a plurality of the magnetic field detection devices 1 according to the present embodiment are arranged in an array with the axial directions of the cancel coils coinciding with one another, the magnetic sensors S21 to S24 for detecting the signal magnetic field component can be arranged in a matrix in the xy plane. In the example illustrated in FIG. 12, the magnetic sensor S21, S22, S23 or S24 is disposed at each of the intersections between the virtual lines x1 to x6 extending in the x-direction and the virtual lines y10 to y6 extending in the y-direction. By designing a pitch P between the virtual lines x1 to x6 and a pitch P between the virtual lines y1 to y6 equal to each other, the spatial distribution of the signal magnetic field component can be measured over a wide range.

When a plurality of the magnetic field detection devices 1 are arranged in an array, the magnetic sensor S1 for detecting the environmental magnetic field component need not be provided in all the magnetic field detection devices 1, but it may be provided only in one of the magnetic field detection devices 1 and, in this case, the feedback current F1 may be supplied to the cancel coil C2 of each of the plurality of magnetic field detection devices 1. This can reduce the number of magnetic sensors to be used.

Figure 13:
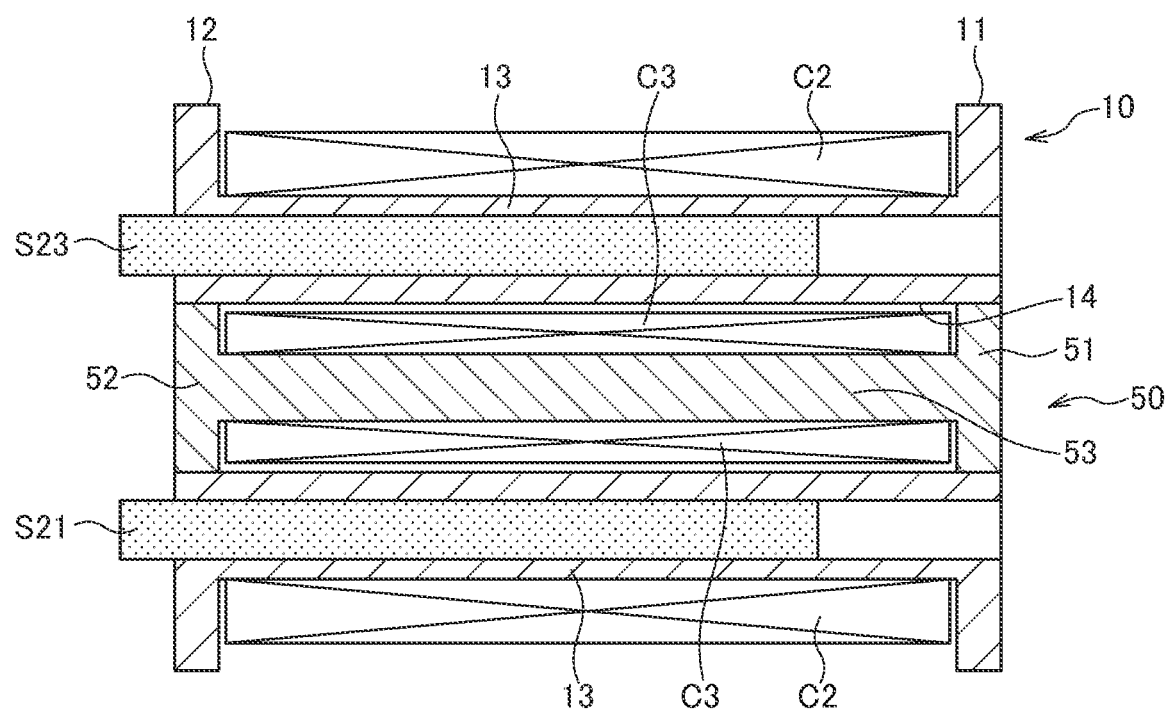
FIG. 13 is a schematic cross-sectional view for explaining the structure of a magnetic field detection device 2 according to a second embodiment of the present invention.
Figure 14:
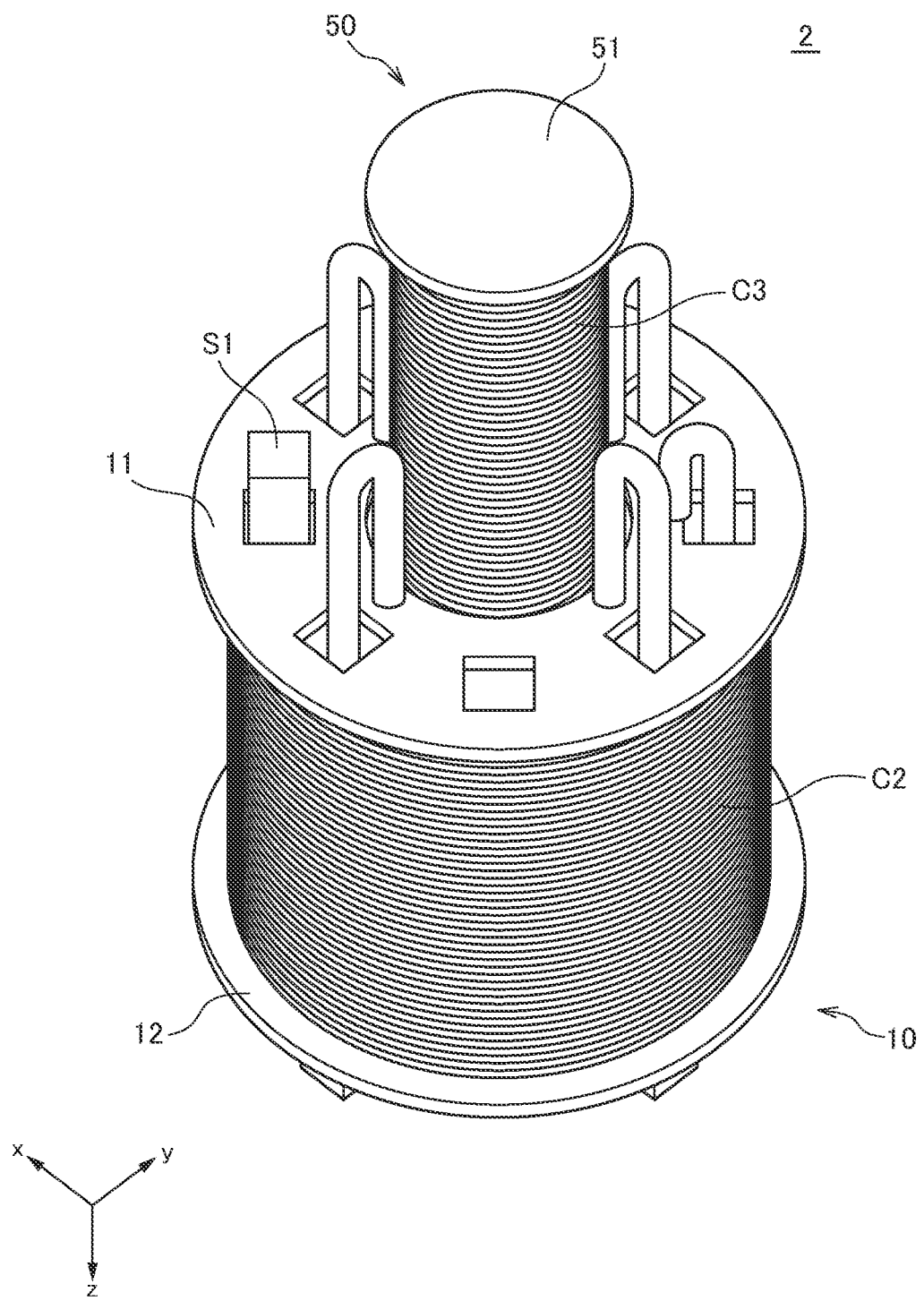
FIG. 14 is a schematically exploded perspective view of the outer appearance of the magnetic field detection device 2.

FIG. 13 is a schematic cross-sectional view for explaining the structure of a magnetic field detection device 2 according to a second embodiment of the present invention. FIG. 14 is a schematically exploded perspective view of the outer appearance of the magnetic field detection device 2.

As illustrated in FIG. 13, the magnetic field detection device 2 according to the second embodiment differs from the magnetic field detection device 1 according to the first embodiment in that it includes a bobbin 50 inserted into the hollow part 14 of the bobbin 10 and a cancel coil C3 wound around a winding core part 53 of the bobbin 50. Other basic configurations are the same as those of the magnetic field detection device 1 according to the first embodiment, so the same reference numerals are given to the same elements, and overlapping description will be omitted.

Figure 15:
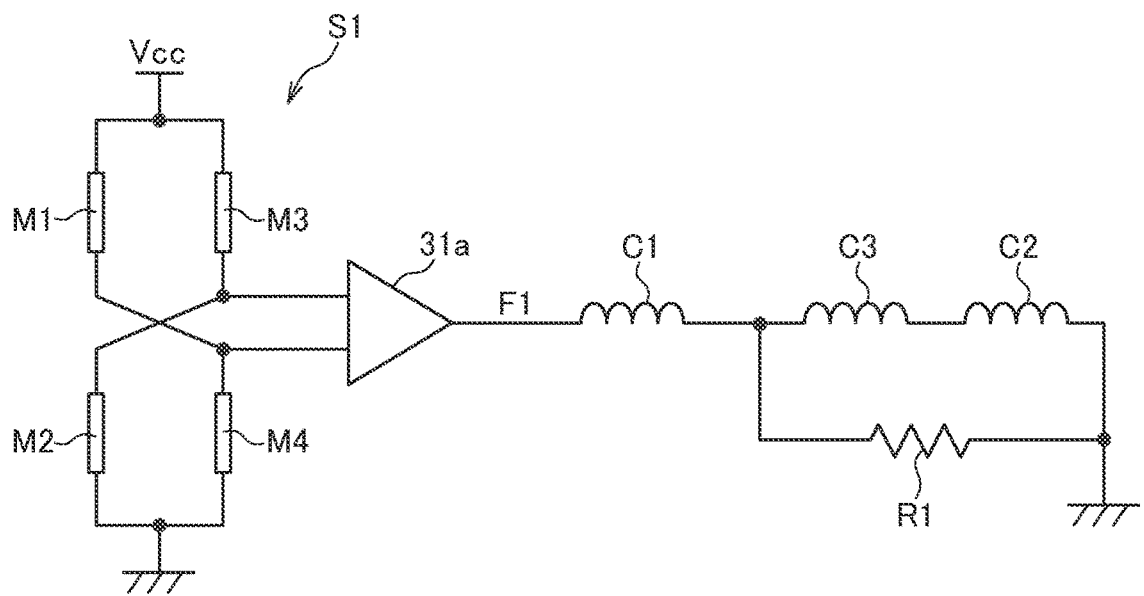
FIG. 15 is a circuit diagram of the feedback loop constituted by the magnetic sensor S1, feedback circuit 31, and cancel coils C2 and C3.

The bobbin 50 has the winding core part 53 and flange parts 51 and 52 provided at both ends of the winding core part 53 in the z-direction. The cancel coil C3 is wound around the winding core part 53 of the bobbin 50, and thus the axial direction of the cancel coil C3 is the z-direction. As illustrated in FIG. 15, the cancel coil C3 is connected in series to the cancel coil C2. As a result, it is possible to generate a stronger cancel magnetic field than in the magnetic field detection device 1 according to the first embodiment.

Figure 16:
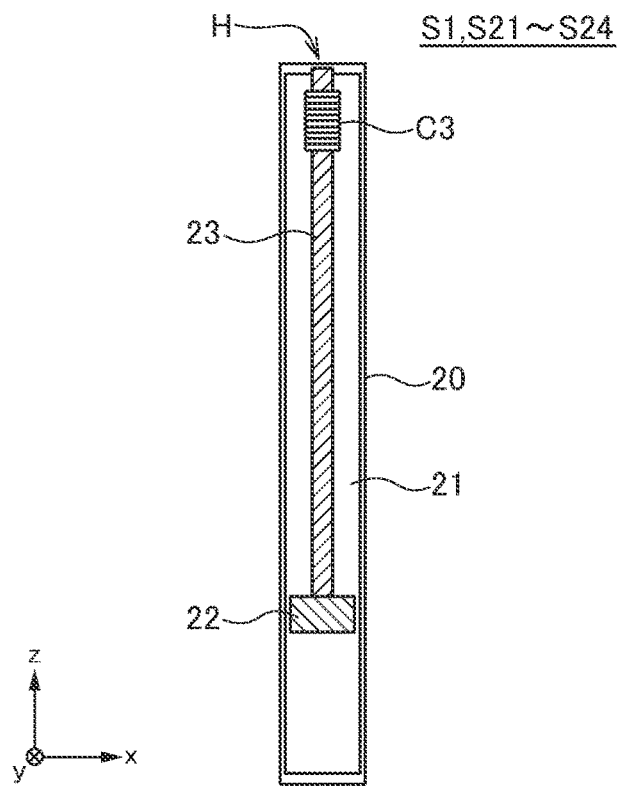
FIG. 16 is a schematic view illustrating an example of the internal structure of the magnetic sensors S1 and S21 to S24 including the cancel coil C3.

The cancel coil C3 may be wound around the magnetism collector 23 in the magnetic sensor S1, as illustrated in FIG. 16. With this configuration, even when the environmental magnetic field component is relatively strong, the magnetism collector 23 can be prevented from being magnetically saturated. The configuration illustrated in FIG. 16 is applicable to the magnetic sensors S21 to S24.

Figure 17:
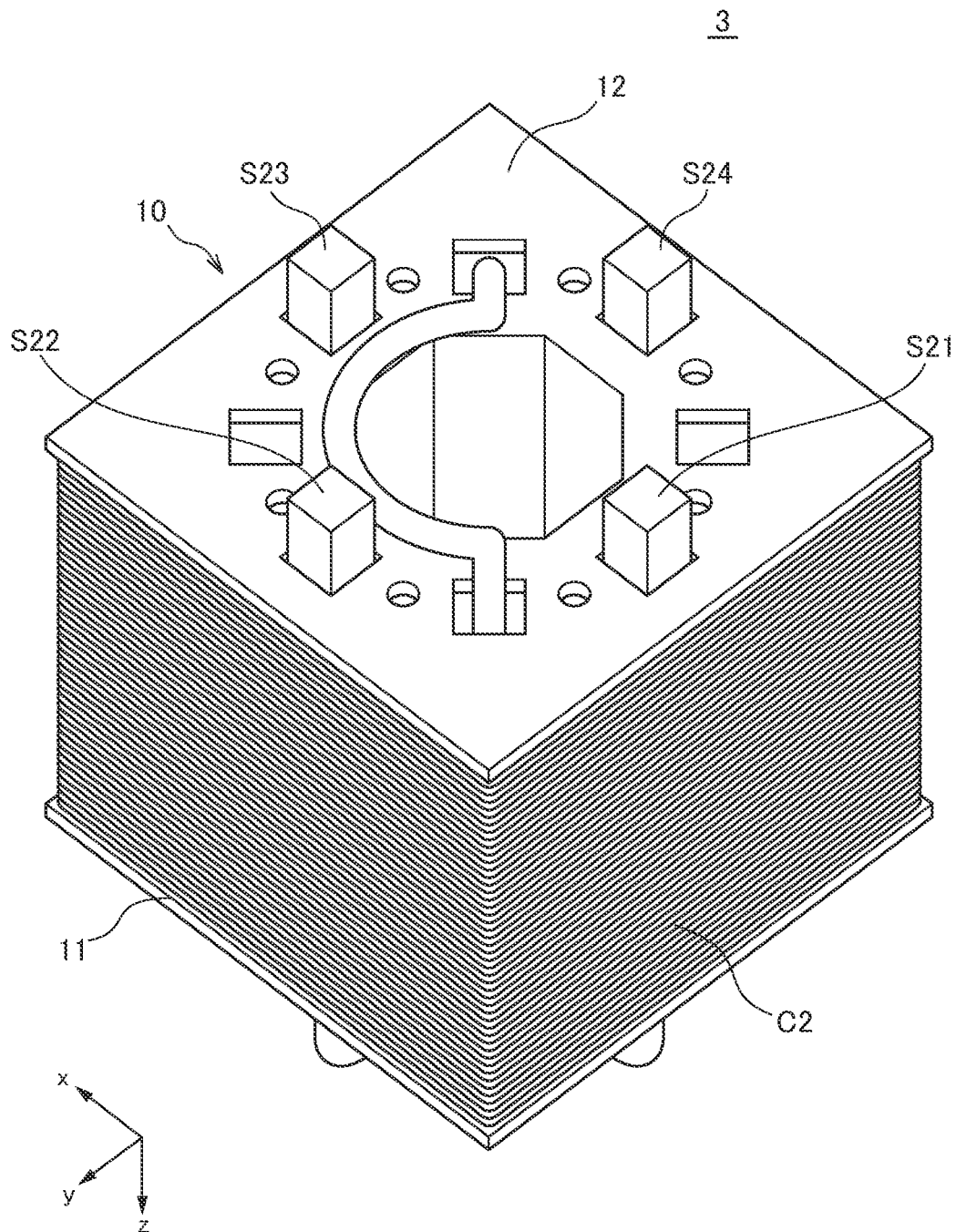
FIG. 17 is a schematic perspective view illustrating the outer appearances of magnetic field detection device 3 according to a third embodiment of the present invention.
Figure 18:
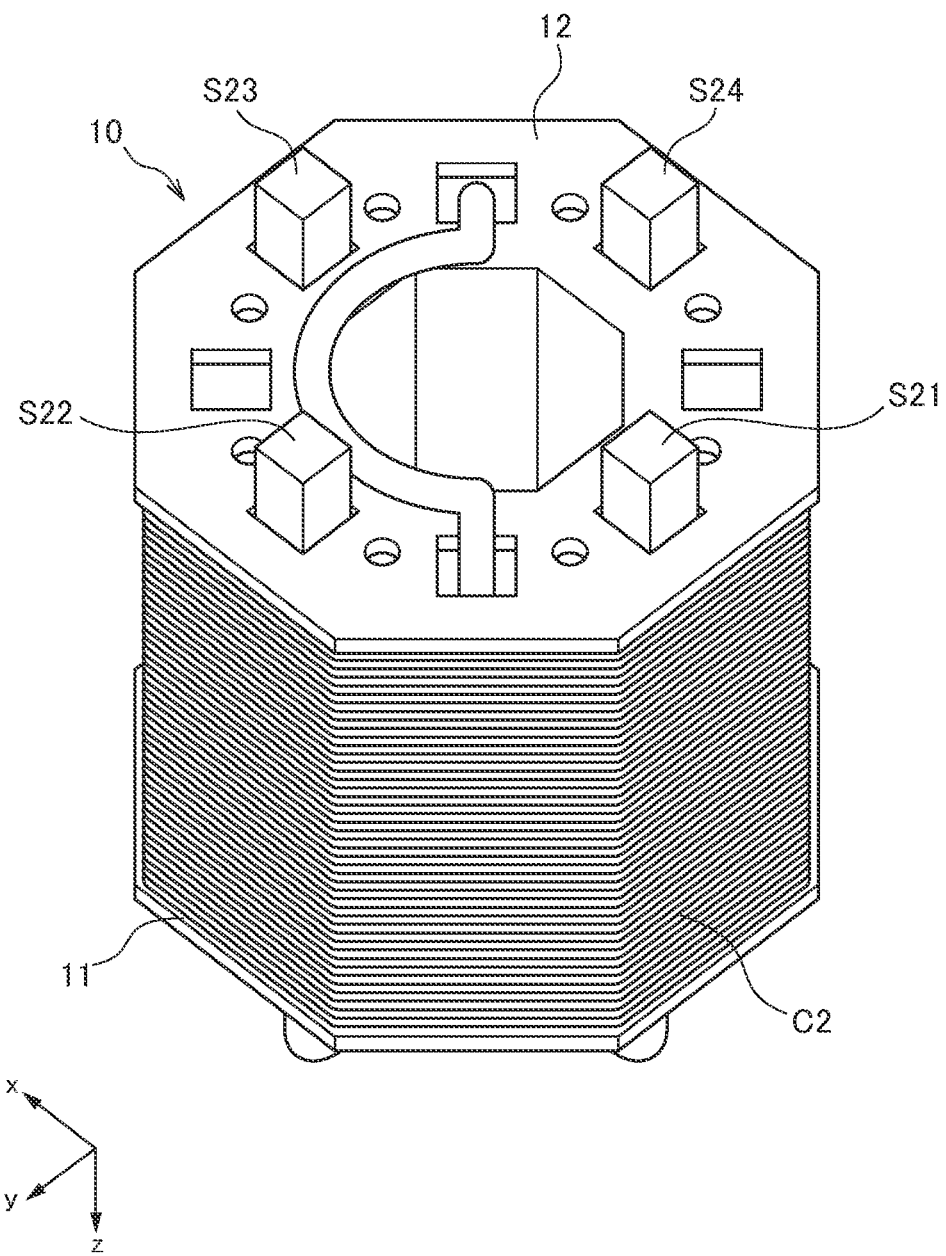
FIG. 18 is a schematic perspective view illustrating the outer appearances of magnetic field detection device 4 according to a fourth embodiment of the present invention.
Figure 19:
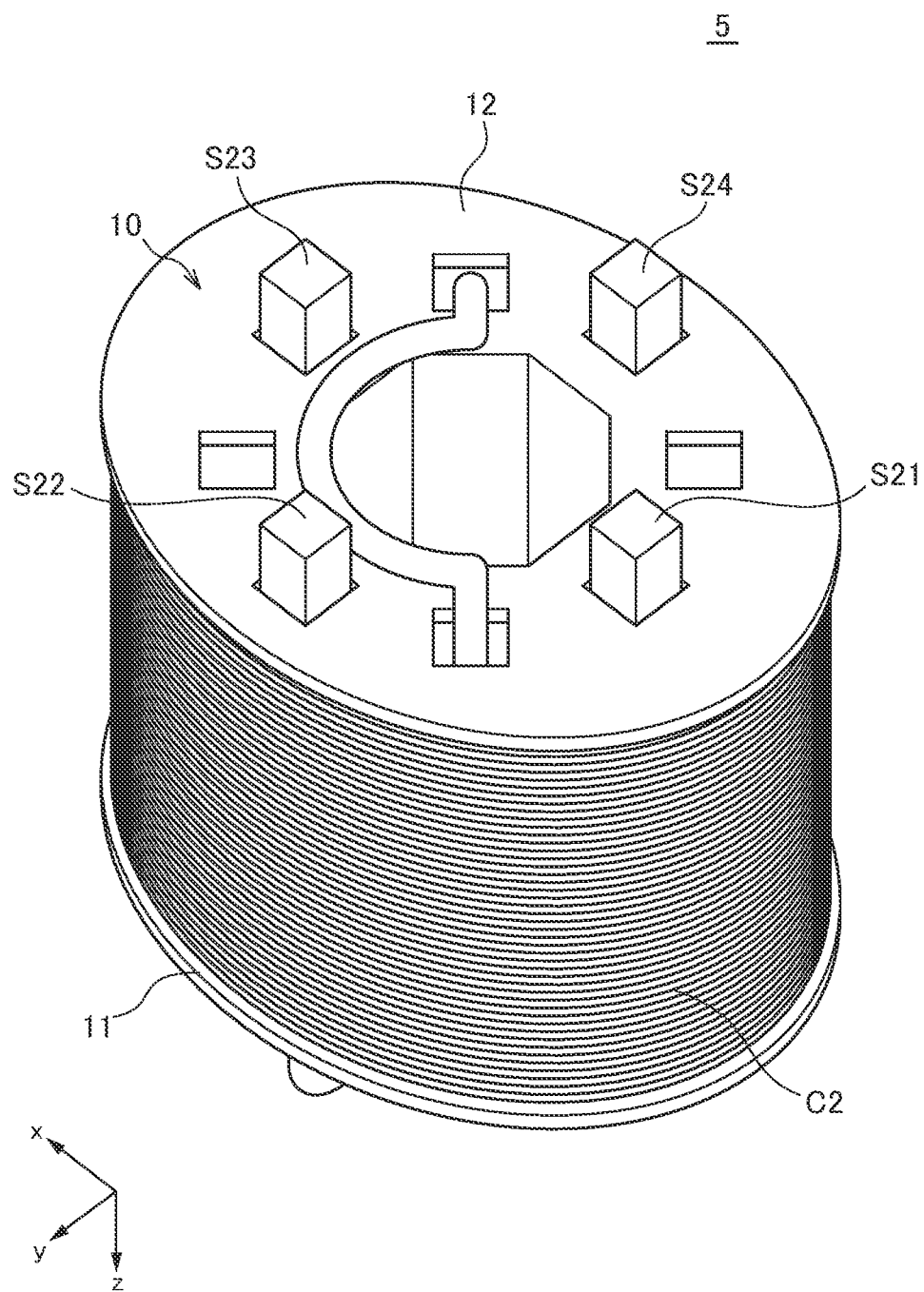
FIG. 19 is a schematic perspective view illustrating the outer appearances of magnetic field detection device 5 according to a fifth embodiment of the present invention.

FIGS. 17 to 19 are schematic perspective views illustrating the outer appearances of magnetic field detection devices 3 to 5 according to third to fifth embodiments of the present invention.

As illustrated in FIG. 17, the magnetic field detection device 3 according to the third embodiment differs from the magnetic field detection device 1 according to the first embodiment in that the bobbin 10 has a quadrangular shape as viewed in the z-direction. As illustrated in FIG. 18, the magnetic field detection device 4 according to the fourth embodiment differs from the magnetic field detection device 1 according to the first embodiment in that the bobbin 10 has an octagonal shape as viewed in the z-direction. As illustrated in FIG. 19, the magnetic field detection device 5 according to the fifth embodiment differs from the magnetic field detection device 1 according to the first embodiment in that the bobbin 10 has an elliptic shape as viewed in the z-direction.

As exemplified by the magnetic field detection devices 3 to 5 according to the third to fifth embodiments, the shape of the bobbin is not limited to a circular shape in the present invention.

Figure 20:
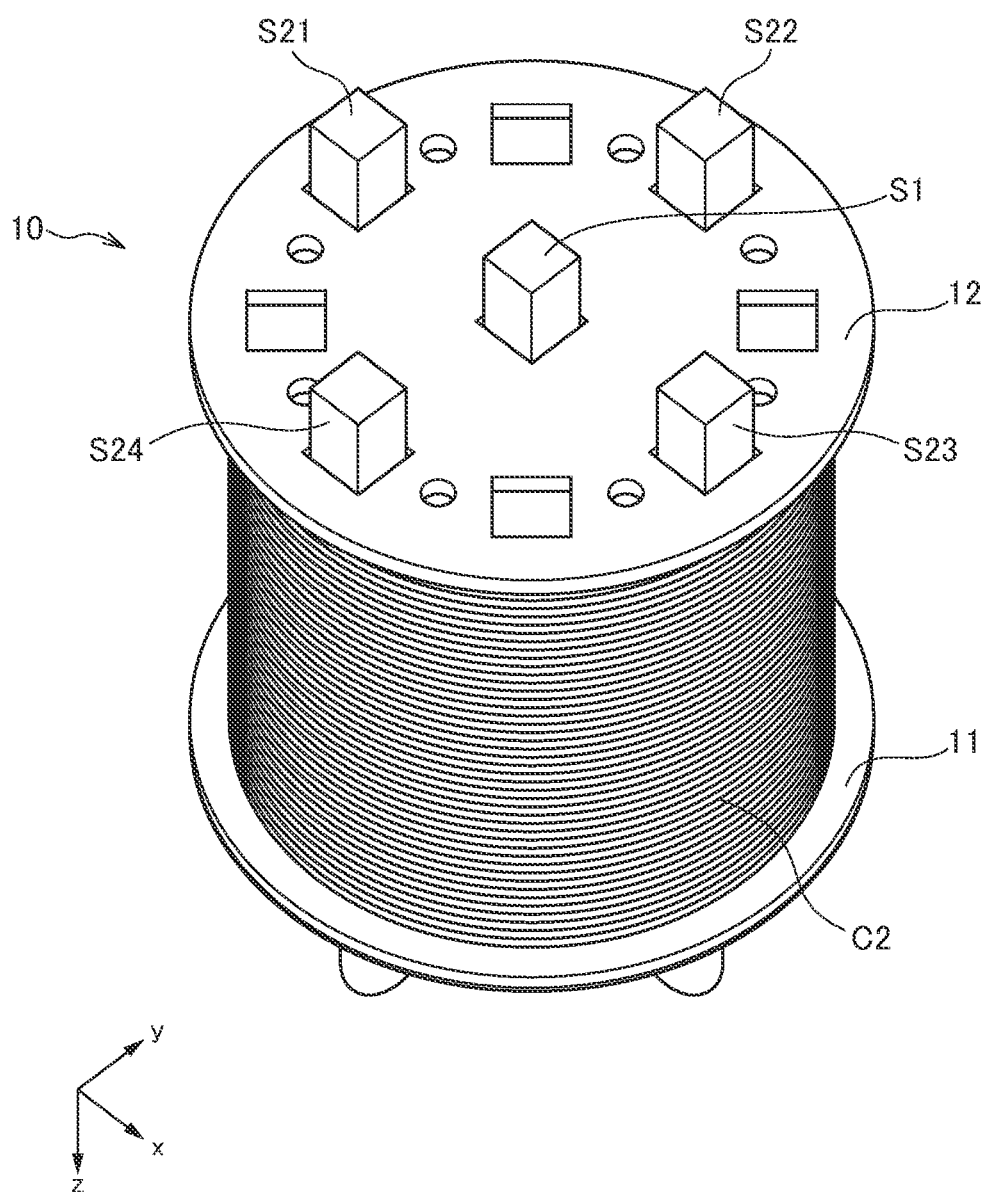
FIG. 20 is a schematic perspective view illustrating the outer appearances of magnetic field detection device 6 according to a sixth embodiment of the present invention.

FIG. 20 is a schematic perspective view illustrating the outer appearance of a magnetic field detection device 6 according to a sixth embodiment of the present invention.

As illustrated in FIG. 20, the magnetic field detection device 6 according to the sixth embodiment differs from the magnetic field detection device 1 according to the first embodiment in that the position of the magnetic sensor S1 in the z-direction and the positions of the magnetic sensors S21 to S24 in the z-direction are the same and that the position of the magnetic sensor S1 in the radial direction centering around the coil axis and the positions of the magnetic sensors S21 to S24 in the radial direction centering around the coil axis are different. In the example illustrated in FIG. 20, the magnetic sensor S1 is positioned at the center of the coil axis.

As exemplified by the magnetic field detection device 6 according to the sixth embodiment, the magnetic sensor S1 and the magnetic sensors S21 to S24 may be the same in position in the z-direction in the present invention. Further, in the present embodiment, the magnetic sensor S1 and the magnetic sensors S21 to S24 are different in position in the radial direction centering around the coil axis, so that when the environmental magnetic field component is completely cancelled at the position (center of the coil axis) where the magnetic sensor S1 is installed, it remains at the positions (positions offset from the center of the coil axis) where the magnetic sensors S21 to S24 are installed. Therefore, in the present embodiment, it is necessary to adjust the gain of the feedback loop so as not to completely cancel the environmental magnetic field component at the position of the magnetic sensor S1 but to completely cancel the environmental magnetic field component at the positions of the magnetic sensors S21 to S24.

Figure 21:
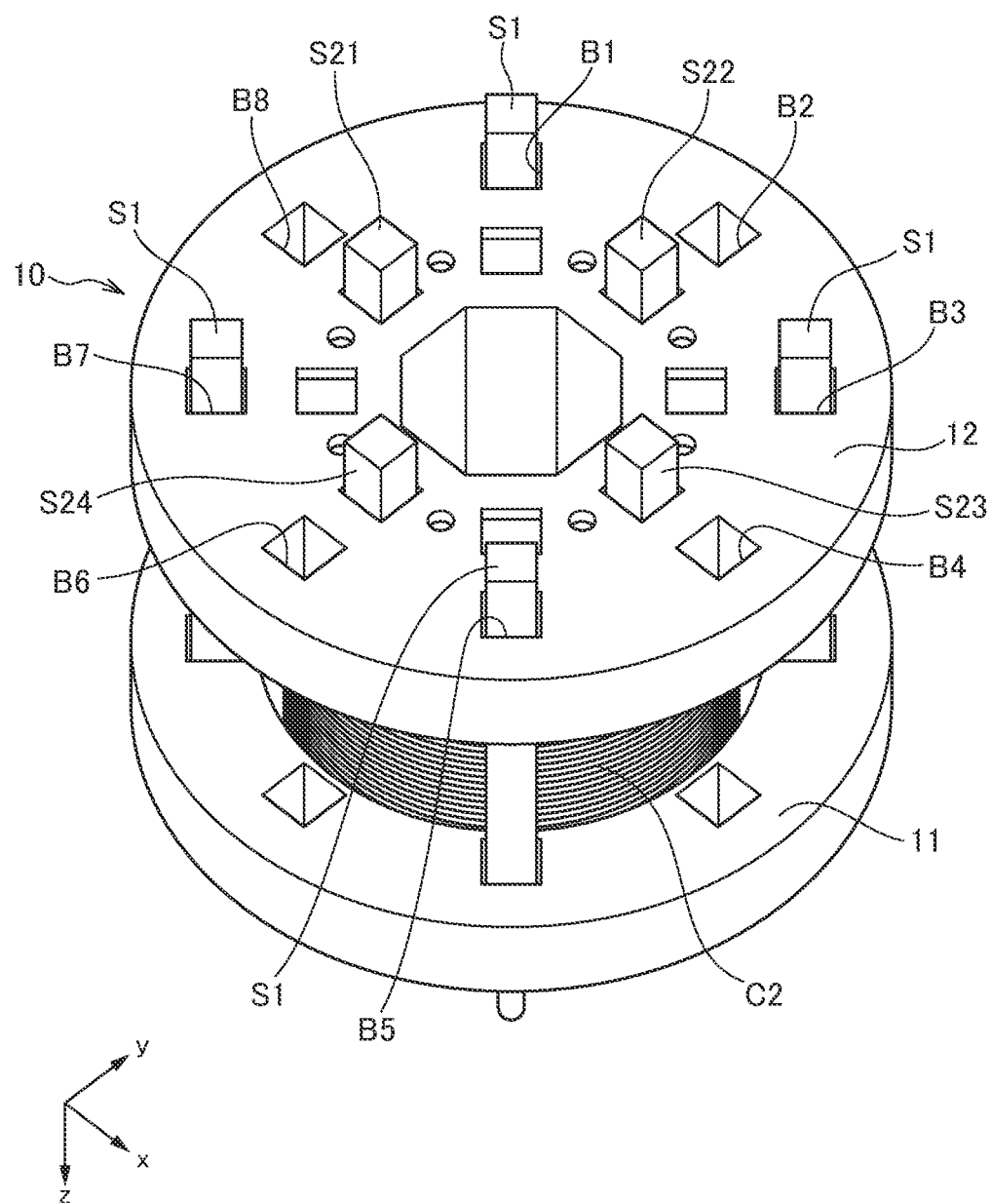
FIG. 21 is a schematic perspective view illustrating the outer appearances of magnetic field detection device 7 according to a seventh embodiment of the present invention.

FIG. 21 is a schematic perspective view illustrating the outer appearance of a magnetic field detection device 7 according to a seventh embodiment of the present invention.

As illustrated in FIG. 21, the magnetic field detection device 7 according to the seventh embodiment differs from the magnetic field detection device 1 according to the first embodiment in that the areas of the respective flange parts 11 and 12 in the radial direction are enlarged and that cavities B1 to B8 are formed on a radially outer side of the winding core part 13. In the example illustrated in FIG. 21, the four magnetic sensors S21 to S24 are installed respectively in any one of the cavities A1 to A8 positioned on a radially inner side, and the four magnetic sensors S1 are installed in the cavities B1 to B8 positioned on the radially outer side.

As exemplified by the magnetic field detection device 7 according to the seventh embodiment, all the cavities for installation of the magnetic sensors need not be the same in radial position, but a plurality of cavities different in radial position may be formed in the bobbin. Further, the number of the magnetic sensors S1 for detecting the environmental magnetic field component is not limited to one, but may be two or more.

While the preferred embodiment of the present invention has been described, the present invention is not limited to the above embodiment, and various modifications may be made within the scope of the present invention, and all such modifications are included in the present invention.

For example, although the number of the magnetic sensors for detecting the signal magnetic field component is four, and the number of the magnetic sensors for detecting the environmental magnetic field component is one in the magnetic field detection device 1 according to the first embodiment, the numbers of the magnetic sensors for detecting the signa magnetic field component and environmental magnetic field component are not particularly limited to specific numbers.

1-7 magnetic field detection device
10, 50 bobbin
11, 12, 51, 52 flange part
13, 53 winding core part
14 hollow part
15 circuit board
20 sensor housing body
21 substrate
22 sensor chip
23 magnetism collector
24, 25 insulating film
31 feedback circuit
31a differential amplifier
32 detection circuit
32a differential amplifier
33 voltage measurement circuit
40 cancel space
A1-A8, B1-B8 cavity
C1-C3 cancel coil
F1, F2 feedback current
H sensor head
L0-L4 wiring
M1-M4 magnetoresistance effect element
R1, R2 resistor
S1, S21-S24 magnetic sensor

What is claimed is:

1. A magnetic field detection device comprising:
a bobbin;
a cancel coil wound around a winding core part of the bobbin;

first and second magnetic sensors fixed to mutually different positions of the bobbin and configured to detect a magnetic field component in mutually a same direction; and a feedback circuit that makes a cancel current flow in the cancel coil according to an output signal of the first magnetic sensor to cancel an environmental magnetic field in a cancel space, wherein the second magnetic sensor is disposed within the cancel space.

2. The magnetic field detection device as claimed in claim 1, wherein each of the first and second magnetic sensors is disposed at a position overlapping an inner diameter area of the cancel coil as viewed in an axial direction of the cancel coil.

3. The magnetic field detection device as claimed in claim 2, wherein sensor heads of the first and second magnetic sensors are different in position in axial direction of the cancel coil.

4. The magnetic field detection device as claimed in claim 1, wherein sensor heads of the first and second magnetic sensors are different in position in an axial direction of the cancel coil.

5. The magnetic field detection device as claimed in claim 4, wherein the winding core part of the bobbin has a first cavity opened at a first flange part and a second cavity opened at a second flange part, wherein the first magnetic sensor is installed in the first cavity, and wherein the second magnetic sensor is installed in the second cavity.

6. The magnetic field detection device as claimed in claim 5, wherein the sensor head of the first magnetic sensor protrudes from the first flange part of the bobbin, and wherein the sensor head of the second magnetic sensor protrudes from the second flange part of the bobbin.

7. The magnetic field detection device as claimed in claim 6, further comprising a circuit board fixed to the first or second flange part, wherein the feedback circuit is provided in the circuit board.

8. The magnetic field detection device as claimed in claim 5, further comprising a circuit board fixed to the first or second flange part, wherein the feedback circuit is provided in the circuit board.

9. The magnetic field detection device as claimed in claim 1, wherein a plurality of the second magnetic sensors are provided.

10. A magnetic field detection device array comprising a plurality of the magnetic field detection devices as claimed in claim 9, wherein the plurality of magnetic field detection devices are arranged in a matrix with axial directions of the cancel coils coinciding with one another.

11. A magnetic field detection device array obtained by arranging a plurality of magnetic field detection devices in an array, wherein at least one of the plurality of magnetic field detection devices has a same configuration as that of the magnetic field detection device as claimed in claim 9, wherein remaining magnetic field detection devices each have a configuration obtained by removing the first magnetic sensor from the magnetic field detection device as claimed in claim 9 and configured to cancel the environmental magnetic field in a cancel space by making the cancel current flow in the cancel coil, and wherein the plurality of magnetic field detection devices are arranged in a matrix with axial directions of the cancel coils coinciding with one another.

12. The magnetic field detection device array as claimed in claim 11, wherein the plurality of second magnetic sensors provided in each of the plurality of magnetic field detection devices are disposed at each of the intersections between a plurality of first virtual lines extending in a first direction perpendicular to the axial direction of the cancel coil and a plurality of second virtual lines extending in a second direction perpendicular to the axial direction of the cancel coil and the first direction, and wherein a pitch between the plurality of first virtual lines and a pitch between the plurality of second virtual lines are equal to each other.

13. The magnetic field detection device as claimed in claim 1, further comprising a resistor connected in parallel to the cancel coil and having a resistance value larger than an equivalent series resistance of the cancel coil.

14. The magnetic field detection device array as claimed in claim 10, wherein the plurality of second magnetic sensors provided in each of the plurality of magnetic field detection devices are disposed at each of the intersections between a plurality of first virtual lines extending in a first direction perpendicular to the axial direction of the cancel coil and a plurality of second virtual lines extending in a second direction perpendicular to the axial direction of the cancel coil and the first direction, and wherein a pitch between the plurality of first virtual lines and a pitch between the plurality of second virtual lines are equal to each other.

* * * * *